(12) United States Patent
Papa Rao et al.

(10) Patent No.: US 8,946,844 B2
(45) Date of Patent: Feb. 3, 2015

(54) INTEGRATION OF A TITANIA LAYER IN AN ANTI-REFLECTIVE COATING

(71) Applicant: International Business Machines Corporation, Armonk, NY (US)

(72) Inventors: Satyavolu S. Papa Rao, Poughkeepsie, NY (US); Kathryn C. Fisher, Brooklyn, NY (US); Harold J. Hovel, Katonah, NY (US); Qiang Huang, Croton on Hudson, NY (US); Young-hee Kim, Mohegan Lake, NY (US); Susan Huang, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/780,887

(22) Filed: Feb. 28, 2013

(65) Prior Publication Data

US 2014/0000693 A1    Jan. 2, 2014

Related U.S. Application Data

(63) Continuation of application No. 13/534,037, filed on Jun. 27, 2012.

(51) Int. Cl.
*H01L 21/00* (2006.01)
*H01L 31/0216* (2014.01)

(52) U.S. Cl.
CPC .......... *H01L 31/02168* (2013.01); *Y02E 10/52* (2013.01)
USPC .............................. 257/437; 136/256; 438/98

(58) Field of Classification Search
None
See application file for complete search history.

(56) References Cited

U.S. PATENT DOCUMENTS

| | | | |
|---|---|---|---|
| 3,943,003 A | 3/1976 | Dendall | |
| 2009/0223549 A1* | 9/2009 | Ounadjela et al. | 136/244 |
| 2009/0286349 A1 | 11/2009 | Rohatgi et al. | |
| 2010/0003817 A1* | 1/2010 | Hamm et al. | 438/664 |
| 2011/0132443 A1* | 6/2011 | Schultz-Wittman et al. | 136/252 |
| 2011/0174369 A1* | 7/2011 | Hovel et al. | 136/256 |
| 2012/0060908 A1* | 3/2012 | Crafts | 136/255 |

OTHER PUBLICATIONS

Williams, K.R. et al., "Etch Rates for Micromachining Processing-Part II" Journal of Microelectromechanical Systems (Dec. 2003) pp. 761-778, vol. 12, No. 6.

(Continued)

*Primary Examiner* — Charles Garber
*Assistant Examiner* — Evren Seven
(74) *Attorney, Agent, or Firm* — Scully, Scott, Murphy & Presser, P.C.; H. Daniel Schnurmann (57) ABSTRACT

A stack of a first anti-reflective coating (ARC) layer and a titanium layer is formed on a front surface of a semiconductor substrate including a p-n junction, and is subsequently patterned so that a semiconductor surface is physically exposed in metal contact regions of the front surface of the semiconductor substrate. The remaining portion of the titanium layer is converted into a titania layer by oxidation. A metal layer is plated on the metal contact regions, and a copper line is subsequently plated on the metal layer or a metal semiconductor alloy derived from the metal layer. A second ARC layer is deposited over the titania layer and the copper line, and is subsequently patterned to provide electrical contact to the copper line.

19 Claims, 8 Drawing Sheets

(56) References Cited

OTHER PUBLICATIONS

Williams, K.R. et al., "Etch Rates for Micromachining Processing," Journal of Microelectromechanical Systems (Dec. 1996) pp. 256-269, vol. 5, No. 4.
Hidalgo, M. et al., "Laser-Induced Breakdown Spectrometry of Titanium Dioxide Antireflection Coatings in Photovoltaic Cells" Analytical Chemistry (Apr. 1, 1996) pp. 1095-1100, vol. 68, No. 7.

Office Action dated Apr. 8, 2014 received in related U.S. Patent Application, namely U.S. Appl. No. 13/534,037.
Final Office Action dated Aug. 11, 2014 received in U.S. Appl. No. 13/534,037.

\* cited by examiner

INTEGRATION OF A TITANIA LAYER IN AN ANTI-REFLECTIVE COATING

CROSS REFERENCE TO RELATED APPLICATION

This application is a continuation of U.S. patent application Ser. No. 13/534,037, filed Jun. 27, 2012 the entire content and disclosure of which is incorporated herein by reference.

BACKGROUND

The present disclosure generally relates to an anti-reflective coating, and particularly to a method of forming an anti-reflective coating including a titania layer and a structure including the same. Further, the present disclosure relates to a method of forming an anti-reflective coating that has multiple layers including with a structure that includes dual anti-reflective coating layers.

Light that impinges onto a front surface of a photovoltaic device passes through the front surface and generates an electron-hole pair within the semiconductor material. An electrostatic field generated by the p-n junction causes the electrons generated by the light to move toward the n-type material, and the holes generated by the light to move toward the p-type material. Contacts are made to the front side and the back side of the photovoltaic device to collect the charge carriers, thereby providing electromotive force for the photovoltaic device.

Reflection of light at the front surface reduces the efficiency of a photovoltaic device. In order to increase the efficiency of a photovoltaic device, therefore, it is necessary to minimize the reflection of light at the front surface.

BRIEF SUMMARY

A stack of a first dielectric layer and a titanium layer is formed on a front surface of a semiconductor substrate including a p-n junction, and is subsequently patterned so that a semiconductor surface is physically exposed in metal contact regions of the front surface of the semiconductor substrate. The remaining portion of the titanium layer is converted into a titania layer by oxidation. A metal layer is plated on the metal contact regions, and a copper line is subsequently plated on the metal layer or a metal semiconductor alloy derived from the metal layer. A second layer is deposited over the titania layer and the copper line to complete the formation of the anti-reflection coating (ARC) stack, and is subsequently patterned to provide electrical contact to the copper line.

In one embodiment, an anti-reflection coating (ARC) stack including a first dielectric layer, such as a silicon nitride layer, can be formed on a front surface of a semiconductor substrate including a p-n junction. The ARC stack can be subsequently patterned so that a semiconductor surface is physically exposed in metal contact regions of the front surface of the semiconductor substrate. A metal layer can be plated on the metal contact regions, and a copper line can be subsequently plated on the metal layer or a metal semiconductor alloy derived from the metal layer. A second ARC layer can be deposited over the first ARC layer and the copper line, and can be subsequently patterned to provide electrical contact to the copper line.

The function of the dielectric layer that is placed immediately in contact with a silicon surface can be twofold. The dielectric layer can function as a part of the anti-reflection coating (ARC) of the solar cell. Further, the dielectric layer can also serve as a surface passivation layer, whereby the recombination of electron-hole pairs (that are formed by the incident light) is retarded, since such recombination reduces the electrons that are collected from the solar cell, and hence reduces the efficiency of the solar cell.

According to an aspect of the present disclosure, a method of forming an anti-reflective coating is provided. A stack, from bottom to top, of a first dielectric material layer and a titanium layer is formed on a semiconductor substrate. The stack is patterned to physically expose a semiconductor surface of the semiconductor substrate. A remaining portion of the titanium layer is converted into a titania layer by oxidation. At least one metallic material is plated on the semiconductor surface while preventing growth of the at least one metallic material from the titania layer. A second dielectric material layer is formed on the titania layer and the at least one metallic material. The first dielectric material layer, the titania layer, and the second dielectric material layer collectively form an anti-reflective coating.

According to another aspect of the present disclosure, an anti-reflective coating (ARC) structure including: a semiconductor substrate; a first dielectric material layer located on the semiconductor substrate; a titania layer located on the first dielectric material layer; at least one metallic material portion in contact with a semiconductor material of the semiconductor substrate and overlying a portion of the titania layer; and a second dielectric material layer located on the titania layer and an outer surface of the at least one metallic material portion, wherein the first dielectric material layer, the titania layer, and the second dielectric material layer collectively constitute an anti-reflective coating layer.

According to yet another aspect of the present disclosure, another method of forming an anti-reflective coating is provided. A stack, from bottom to top, of a first dielectric material layer and a titania layer is formed on a semiconductor substrate. The stack is patterned to physically expose a semiconductor surface of the semiconductor substrate. At least one metallic material is plated on the semiconductor surface while preventing growth of the at least one metallic material from the titania layer. A second dielectric material layer is formed on the titania layer and the at least one metallic material. The first dielectric material layer, the titania layer, and the second dielectric material layer collectively form an anti-reflective coating.

In one embodiment, the patterning of the stack is performed by irradiation by laser. In one embodiment, a p-n junction present in the semiconductor substrate can be selectively deepened only in regions irradiated by the laser.

DETAILED DESCRIPTION

As stated above, the present disclosure relates to a method of forming an anti-reflective coating including a titania layer and a structure including the same, which are now described in detail with accompanying figures. It is noted that like reference numerals refer to like elements across different embodiments. The drawings are not necessarily drawn to scale.

Figure 1:
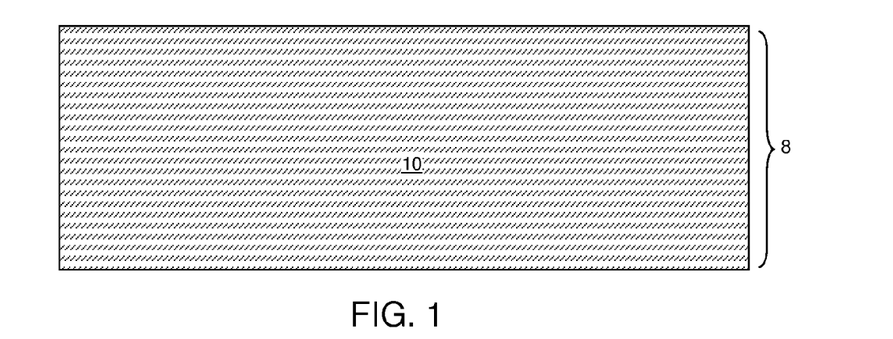
FIG. 1 is a vertical cross-sectional view of an exemplary structure including a semiconductor substrate according to an embodiment of the present disclosure.

Referring to FIG. 1, an exemplary structure according to an embodiment of the present disclosure includes a semiconductor substrate 8 that includes a semiconductor layer 10. The semiconductor layer 10 includes a semiconductor material. The semiconductor material can be silicon, germanium, a silicon germanium alloy, a silicon carbon alloy, a silicon germanium carbon alloy, a III-V compound semiconductor material, a II-VI compound semiconductor material, or any other semiconductor material known in the art. The semiconductor material of the semiconductor substrate can be single crystalline, polycrystalline, or amorphous.

The semiconductor material of the semiconductor layer 10 is doped with dopants of a first conductivity type, which can be p-type or n-type. P-type dopants can be B, Ga, In, or a combination thereof, and n-type dopants can be P, As, Sb, or a combination thereof. Dopant concentration in the semiconductor layer 10 can be from $1.0 \times 10^{14}/cm^3$ to $1.0 \times 10^{21}/cm^3$, although lesser and greater dopant concentrations can also be employed. In one embodiment, dopant concentration in the semiconductor layer 10 can be from $1.0 \times 10^{16}/cm^3$ to $1.0 \times 10^{18}/cm^3$. In one embodiment, the semiconductor material of the semiconductor layer 10 can be p-doped single crystalline silicon.

Figure 2:
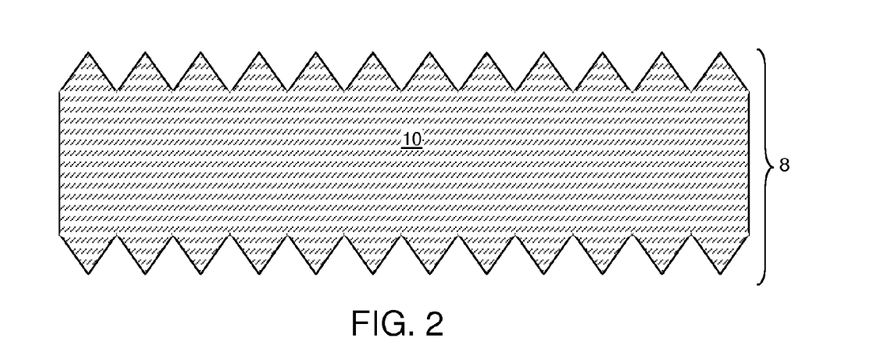
FIG. 2 is a vertical cross-sectional view of the exemplary structure after formation of a faceted front surface of a faceted back side surface according to an embodiment of the present disclosure.

The top surface of the semiconductor layer 10 can be provided as a planar surface or a faceted surface. If the top surface of the semiconductor layer 10 is planar, the top surface of the semiconductor layer 10 can be subsequently converted into a faceted surface. For example, if the semiconductor layer 10 includes a single crystalline semiconductor material, a wet etch in a base solution such as KOH can be employed to form single crystalline facets on the top and bottom surfaces of the semiconductor substrate as illustrated in FIG. 2. Further, any facet-forming etch chemistries for a single crystalline material, which are known as crystallographic etches in the art, can also be employed to form facets on the top and bottom surfaces of the single crystalline material of the semiconductor layer 10. If the semiconductor layer 10 includes a polycrystalline semiconductor material, a wet etch in an acid solution such as a mixture of hydrofluoric acid (HF) and nitric acid ($HNO_3$) can be employed to form polycrystalline facets on the top and bottom surfaces of the semiconductor substrate as illustrated in FIG. 2. While the faceted top surface and the faceted bottom surface of the semiconductor layer 10 are illustrated as having a regular periodicity, it is noted that the illustration in FIG. 2 is only schematic, and that an actual physical faceted top surface and an actual physical faceted bottom surface of the semiconductor layer 10 may have regular or irregular spacing and/or height among the facets.

Figure 3:
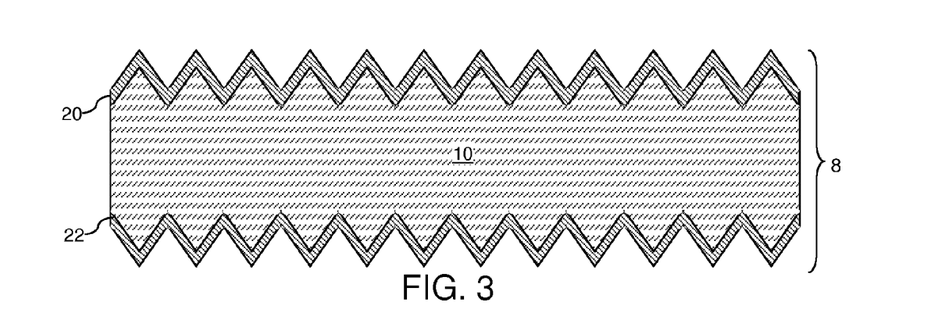
FIG. 3 is a vertical cross-sectional view of the exemplary structure after formation of a front side p-n junction and a back side p-n junction according to an embodiment of the present disclosure.
Figure 4:
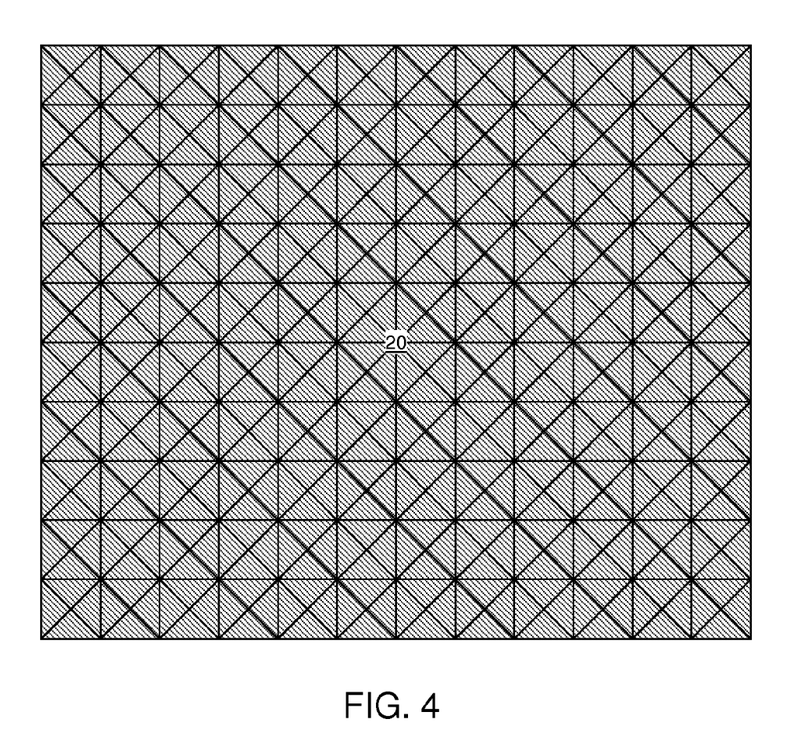
FIG. 4 is a top-down view of the exemplary structure of FIG. 3.

Referring to FIGS. 3 and 4, at least one p-n junction is formed in the semiconductor substrate 8 by converting at least one surface portion of the semiconductor substrate 8 into at least one semiconductor portion having a doping of a second conductivity type, which is the opposite of the first conductivity type. For example, if the first conductivity type is p-type, the second conductivity type is n-type, and vice versa. The at least one p-n junction is formed by introducing dopants of the second conductivity type into at least a surface region of the front surface of the semiconductor substrate 8.

In one embodiment, the at least one p-n junction can include a first p-n junction (a front side p-n junction) formed near the top surface of the semiconductor substrate 8 and a second p-n junction (a back side p-n junction) formed near the bottom surface of the semiconductor substrate 8. For example, dopants of the second conductivity type can be introduced into an upper surface region underneath the top surface and into a lower surface region directly above the bottom surface of the semiconductor substrate 8 during an exposure to a dopant gas at an elevated temperature. If the dopants include phosphorus, POCl₃ doping gas can be employed in an anneal for a duration of about few minutes to 1 hour at an elevated temperature selected in a range from 700° C. to 1,000° C.

In another embodiment, the at least one p-n junction can be a single p-n junction formed near the top surface of the semiconductor substrate 8. For example, dopants of the second conductivity type can be introduced into an upper surface region underneath the top surface of the semiconductor substrate 8 by ion implantation of dopants of the second conductivity type.

Each p-n junction is formed within the semiconductor layer 10 at a location vertically offset from a semiconductor surface. The portion of the semiconductor substrate 8 having a doping of the second conductivity type and located underneath the front surface is herein referred to as a front doped semiconductor portion 20. The portion of the semiconductor substrate 8 having a doping of the second conductivity type and located directly above the back surface is herein referred to as a backside doped semiconductor portion 22. The thickness of the front doped semiconductor portion 20 can be measured by the vertical distance, i.e., the distance as measured in a direction perpendicular to a plane passing through the average height of the faceted front surface of the semiconductor substrate 8, between the front surface of the semiconductor substrate 8 and the p-n junction near the front surface. Likewise, the thickness of the backside doped semiconductor portion 22 can be measured by the vertical distance between the back surface of the semiconductor substrate 8 and the p-n junction near the back surface. The thickness of the front doped semiconductor portion 20 can be from 1 micron to 20 microns, although lesser and greater thicknesses can also be employed. Dopant concentration in the front doped semiconductor portion 20 and the backside doped semiconductor portion 22 can be from $1.0\times10^{17}/cm^3$ to $1.0\times10^{21}/cm^3$, although lesser and greater dopant concentrations can also be employed.

Figure 5:
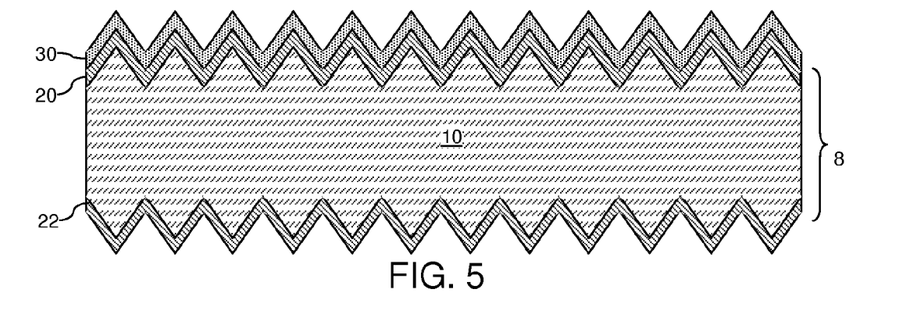
FIG. 5 is a vertical cross-sectional view of the exemplary structure after deposition of a first dielectric material layer on the faceted front surface according to an embodiment of the present disclosure.

Referring to FIG. 5, a first dielectric material layer 30 is deposited on the faceted front surface of the semiconductor substrate 8. The first dielectric material layer 30 includes a dielectric material such as silicon nitride. The first dielectric material layer 30 can be deposited, for example, by chemical vapor deposition (CVD), atomic layer deposition (ALD), or a combination thereof. In one embodiment, the first dielectric material layer 30 can be deposited by plasma enhanced chemical vapor deposition (PECVD). The thickness of the first dielectric material layer 30 can be from 5 nm to 60 nm, although lesser and greater thicknesses can also be employed. In one embodiment, phosphorus doped silicate glass (PSG) can be formed on the surface of the silicon during the phosphoryl chloride (POCl₃) diffusion as the first dielectric layer.

Figure 6:
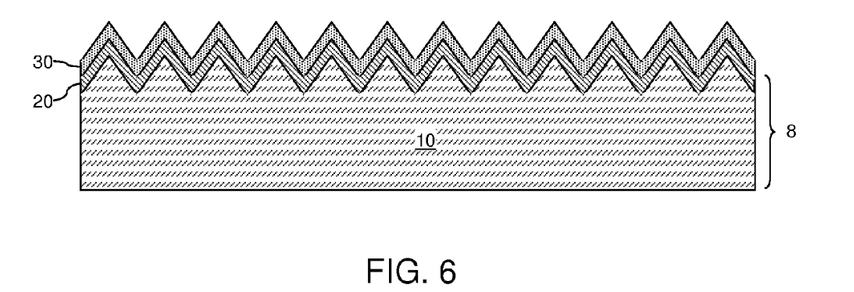
FIG. 6 is a vertical cross-sectional view of the exemplary structure after planarization of the back surface of the semiconductor substrate according to an embodiment of the present disclosure.

Referring to FIG. 6, the back surface of the semiconductor substrate 8 can be processed to remove the backside p-n junction. The process can be performed employing any method for etching one side of a semiconductor substrate. In one embodiment, the process can be performed by subjecting the back side surface of the semiconductor substrate 10 to a wet etch process that employs a chemical that isotropically etches the semiconductor material of the semiconductor substrate 8. For example, tetramethylammonium hydroxide (TMAH) can be employed to isotropically etch the back side surface of the semiconductor substrate 10. This wet-etch also planarizes the surface, but such planarization is not an essential feature. The wet etch chemical can be selected such that the first dielectric material layer 30 present on the top surface of the semiconductor substrate 8 prevents etching of the front surface of the semiconductor substrate 8.

The deliberate removal of the backside p-n junction described above can be omitted depending on the succeeding process step. For instance, if blanket aluminum is reacted with the back surface, the backside p-n junction is overwhelmed, and hence does not need to be removed. If local back-contacts are to be made, however, the backside p-n junction can be removed as described above.

Figure 7:
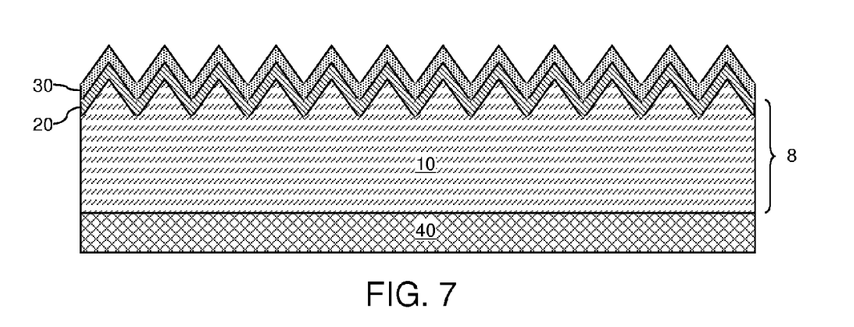
FIG. 7 is a vertical cross-sectional view of the exemplary structure after formation of a back side contact layer according to an embodiment of the present disclosure.

Referring to FIG. 7, a back side contact layer 40 is formed on the back side of the semiconductor substrate 8, for example, by physical vapor deposition (PVD). The back side contact layer 40 can include a metallic material such as aluminum or any other elemental metal or an intermetallic alloy. If the semiconductor layer 10 includes a p-type semiconductor material and if the back side contact layer 40 includes aluminum, a back side field (not explicitly shown) can be formed near the back side contact layer 40 and within a surface portion of the semiconductor substrate 8 such that the back side field is heavily doped with aluminum. The thickness of the back side field can be from 1 micron to 50 micron, although lesser and greater thicknesses can also be employed. The back side contact layer 40 provides an electrical contact to the semiconductor layer 10 having a doping of the first conductivity type.

Local contacts with passivated back-surfaces can also be formed, for instance, by depositing, on the backside, a dielectric passivation layer, which can be, for example, aluminum oxide deposited by atomic layer deposition, followed by deposition of aluminum, and laser processing. Local contacts are formed between the aluminum layer and the silicon substrate. In this case, as was discussed above, the backside p-n junction can be etched away prior to the deposition of the dielectric passivation layer.

Figure 8:
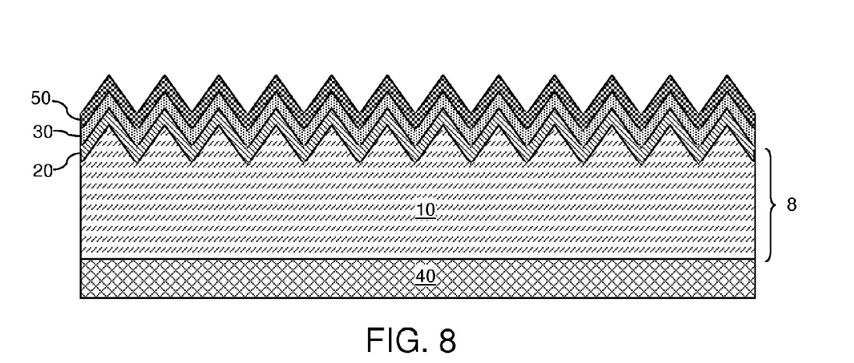
FIG. 8 is a vertical cross-sectional view of the exemplary structure after deposition of a titanium layer according to an embodiment of the present disclosure.

Referring to FIG. 8, a titanium layer 50 is deposited on the surface of the first dielectric material layer 30, for example, by physical vapor deposition (PVD). The thickness of the titanium layer 50 can be from 5 nm to 60 nm, although lesser and greater thicknesses can also be employed. A stack including, from bottom to top, the first dielectric material layer 30 and the titanium layer 50 is formed on the semiconductor substrate 8.

It is noted that removal of the first dielectric material layer 30 or any surface sputtering by an inert gas is not necessary for deposition of the titanium layer 50. Further, it is not necessary to raise the temperature of the exemplary structure above room temperature prior to deposition of the titanium layer 50. Thus, the titanium layer 50 can adhere to the underlying first dielectric material layer 30 with sufficient adhesion strength to remain attached to the first dielectric material layer 30. In one embodiment, the first dielectric material layer 30 includes silicon nitride, and the titanium layer 50 is attached to the silicon nitride material of the first dielectric material layer 30.

Figure 9:
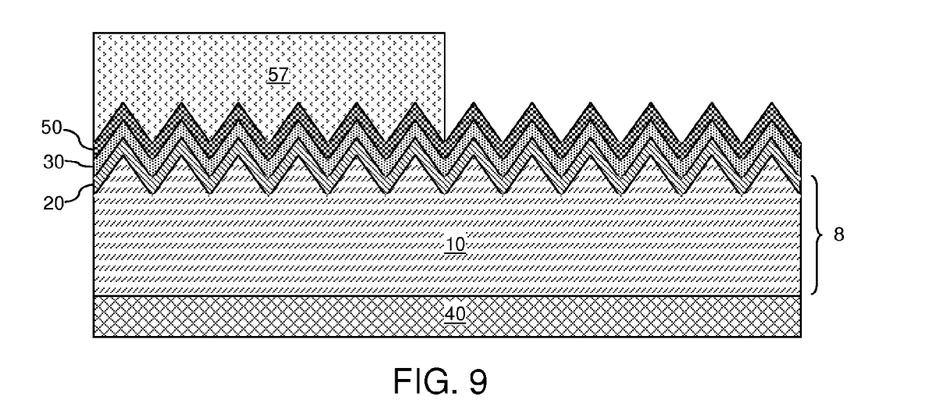
FIG. 9 is a vertical cross-sectional view of the exemplary structure after formation of a patterned masking layer according to an embodiment of the present disclosure.

Referring to FIG. 9, a patterned masking layer 57 is formed over the titanium layer 50. In one embodiment, the patterned masking layer 57 can be a photoresist layer that is applied and lithographically patterned by exposure and development. In another embodiment, the patterned masking layer 57 can be a printed material layer that can be printed or stamped onto the surface of the titanium layer 50.

The pattern in the patterned masking layer 57 is selected such that regions in which formation of an antireflective coating layer is desired are covered with the patterned masking layer 57. Regions in which the antireflective coating layer is not to be formed can be employed to subsequently form an electrical contact to the front doped semiconductor portion 20 having a doping of the second conductivity type.

Figure 10:
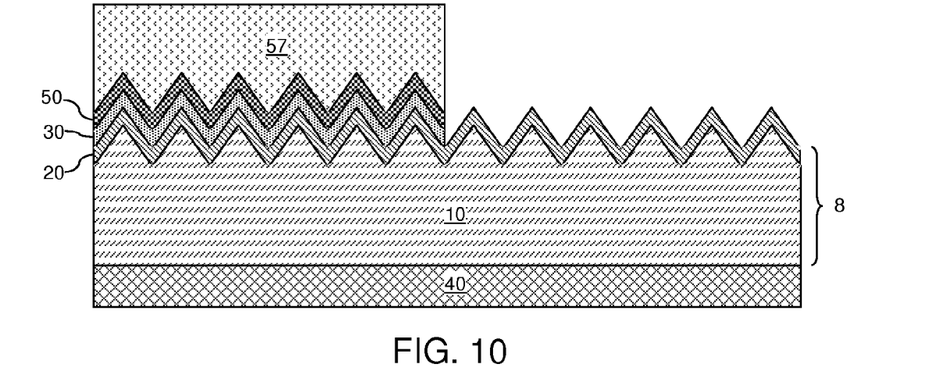
FIG. 10 is a vertical cross-sectional view of the exemplary structure after patterning of the titanium layer and the first dielectric material layer according to an embodiment of the present disclosure.

Referring to FIG. 10, the stack of the first dielectric material layer 30 and the titanium layer 50 is patterned employing the patterned masking layer 57 as an etch mask. The etch of the physically exposed portions of the titanium layer 50 can be performed, for example, by a wet etch employing a mixture of hydrogen peroxide ($H_2O_2$) and dilute hydrofluoric acid (HF). For example, a 20:1:1 mix of $H_2O$, $H_2O_2$, HF at 20° C. can provide an etch rate about 1,100 nm/min for titanium. The etch rate can be adjusted by diluting or concentrating the etch solution and/or by changing the etch temperature. The first dielectric material layer 30 can be etched employing a suitable etch chemistry known in the art. For example, if the first dielectric material layer 30 includes silicon nitride, buffered oxide etch (BOE) or hot phosphoric acid can be employed to etch the silicon nitride material of the first dielectric material layer 30. The etch rate of silicon nitride in a 9:1 buffered oxide etch solution is about 130 nm/min at 20° C.

The pattern in the patterned masking layer 57 is thus replicated in the stack of the first dielectric material layer 30 and the titanium layer 50. A semiconductor surface of the front doped semiconductor portion 20 is physically exposed in regions that are not covered by the patterned masking layer 57.

Figure 11:
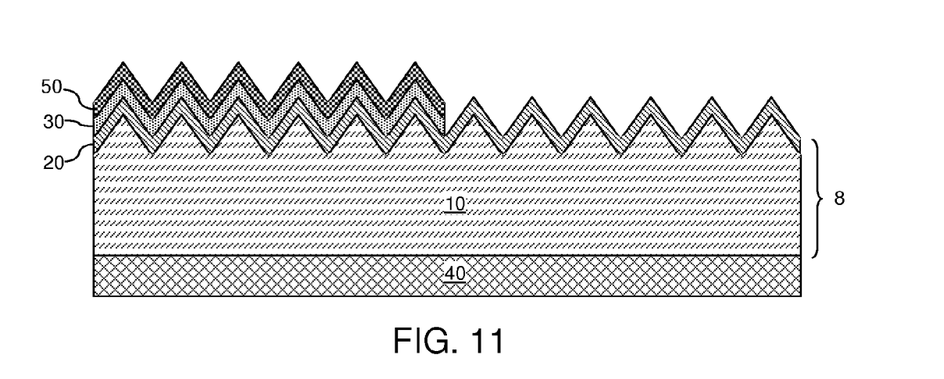
FIG. 11 is a vertical cross-sectional view of the exemplary structure after removal of the masking layer according to an embodiment of the present disclosure.

Referring to FIG. 11, the patterned masking layer 57 can be removed, for example, by ashing (if the patterned masking layer 57 includes a photoresist material) or by a wet etch that dissolves the material of the patterned masking layer without dissolving titanium or the semiconductor material of the semiconductor substrate 8.

Figure 12:
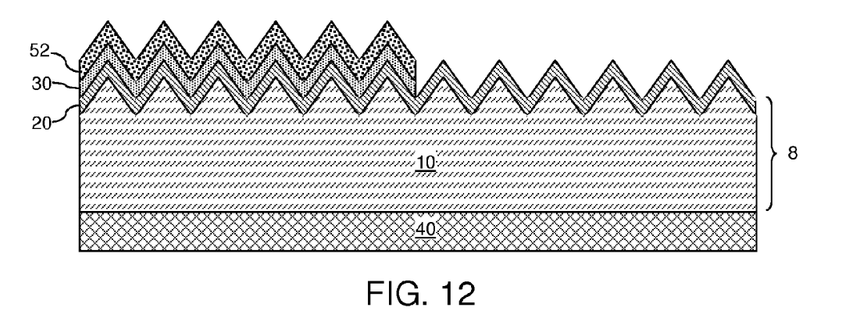
FIG. 12 is a vertical cross-sectional view of the exemplary structure after conversion of the titanium layer into a titania layer according to an embodiment of the present disclosure.

Referring to FIG. 12, the titanium layer 50 is converted into a titania ($TiO_2$) layer 52. The conversion of the titanium layer 50 into the titania layer 52 can be effected, for example, by thermal oxidation in an oxidizing ambient. For example, the exemplary structure can be placed within an oxidation furnace, and annealed at an elevated temperature, which can be between 250° C. and 600° C. The ambient gas can contain oxygen and/or $H_2O$ and optional inert balance gas such as $N_2$ and/or Ar. The duration of the anneal is selected so that the entirety of the titanium layer 50 is converted into the titania layer 52.

A physically exposed surface portion of the front doped semiconductor portion 20 can be converted into a semiconductor oxide material (not explicitly shown). If the first dielectric material layer 20 includes an effective oxidation barrier material such as silicon nitride that blocks diffusion of oxygen therethrough, the first dielectric material layer 30 can prevent conversion of any semiconductor material in the portion of the first doped semiconductor portion 20 that underlies the first dielectric material layer 30. It is noted that the conversion of titanium into titania typically proceeds at a faster rate than conversion of a semiconductor material into a semiconductor oxide. Thus, the thickness of a semiconductor oxide portion formed on the physically exposed surface of the first doped semiconductor portion 20 is typically less than the thickness of the titania layer 52.

Figure 13:
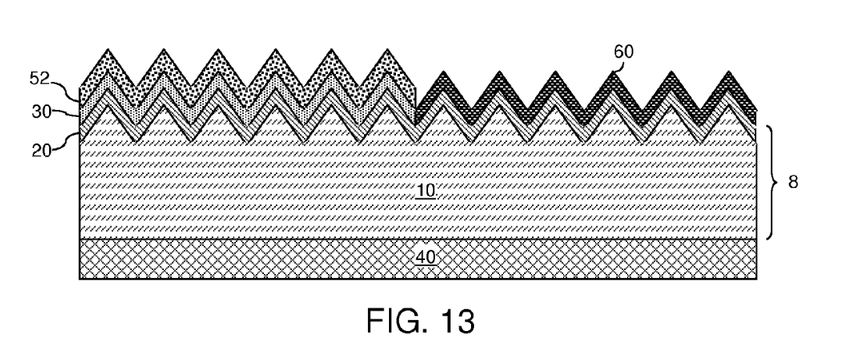
FIG. 13 is a vertical cross-sectional view of the exemplary structure after plating a first metallic material directly on the semiconductor surface while preventing growth of the first metallic material from the titania layer according to an embodiment of the present disclosure.

Referring to FIG. 13, any semiconductor oxide material that is present on the surface of the first doped semiconductor portion 20 is removed by an etch that removes the semiconductor oxide selective to titania. For example, if silicon oxide is present on the first doped semiconductor portion 20 that includes doped silicon, dilute hydrofluoric acid can be employed in a preclean process to remove the silicon oxide selective to titania with selectivity greater than 5. The physically exposed surface of the first doped semiconductor portion 20 can thus be essentially free of silicon oxide after the preclean process.

In one embodiment, laser patterning is employed. After the processing step shown in FIG. 8, a laser irradiation can be employed to directly write the required pattern on the surface of the wafer instead of using lithographic methods and wet-etches to define a pattern in the titanium layer. Portions of the titanium layer can be ablated away wherever the laser energy is directed onto the surface. Unirradiated portions of the titanium can be left essentially undisturbed at other locations. The underlying dielectric layer can also be partially removed by the laser. After the formation of the pattern, the titanium layer can be oxidized as illustrated in FIG. 12.

In one embodiment, the deposition of the titanium layer in the processing step of FIG. 8 can be replaced by the deposition of a titania layer, or by the deposition of a titanium layer immediately followed by in-situ oxidation to convert it to a titania layer. This is then followed by laser patterning, where the titania layer is ablated away in desired locations, while the portion of the titania layer and layers underneath are left substantially undisturbed in unirradiated regions. This can be followed by wet-etching to remove the remaining silicon nitride material to expose the semiconductor surface. The chemistry of the wet etch can be selective such that the titania layer is not etched during the wet etch.

In one embodiment, the laser processing can be done in the presence of phosphorus sources (either by using phosphoric acid over the surface, or by using the phosphorus present in the first dielectric layer if the first dielectric layer is PSG formed during the p-n junction formation). In this case, the p-n junction can be selectively deepened in the regions where the semiconductor surface is exposed, and thus, irradiated by the laser beam. The laser processing conditions can be chosen to melt the silicon in the regions exposed to the laser—and to recrystallize it, including the phosphorus as the dopant. The nitrogen (and Ti) present above the Si are also included in the portions of silicon that are recrystallized, but do not substantially interfere with the electrical functionality of the device.

A first metallic material is plated directly on the semiconductor surface of the physically exposed portions of the first doped semiconductor portion 20 to form a first metallic material portion 60. Because the first dielectric material layer 30 and the titania layer 50 are not conductive, the first metallic material does not grow from the surface of the titania layer 52. Thus, the plating process does not cause the first metallic material to grow from the titania layer 52, and growth of the first metallic material from the titania layer 52 is prevented during the plating of the first metallic material.

The first metallic material can be any metallic material that can be plated by electroplating as known in the art. The first metallic material can include, for example, Au, Ag, Cr, Zn, Sn, Cd, Ni, or a Ni—Co alloy. If the first metallic material is an elemental metal or an intermetallic alloy, the first metallic material portion 60 is a first metal portion. In one embodiment, the first metallic material can be Ni. The thickness of the first metallic material can be from 2 nm to 200 nm, although lesser and greater thicknesses can also be employed.

Figure 14:
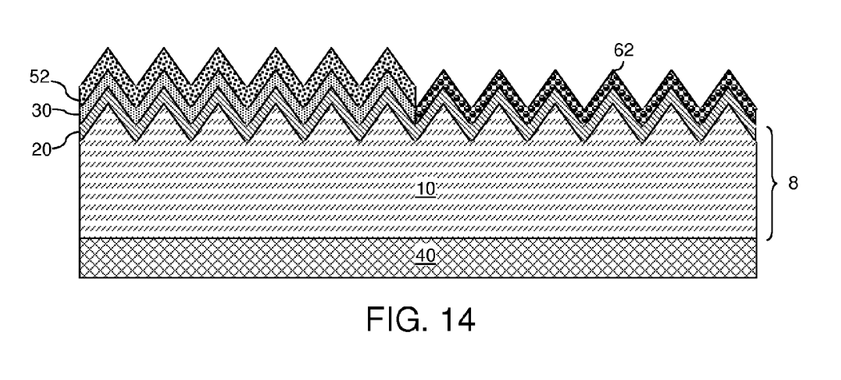
FIG. 14 is a vertical cross-sectional view of the exemplary structure after forming a metal semiconductor alloy portion by reacting the first metallic material with a semiconductor material underneath the semiconductor surface according to an embodiment of the present disclosure.

In one embodiment, the first metallic material portion 62 can be reacted with the underlying semiconductor material of the first doped semiconductor portion 20 to form a metal semiconductor alloy portion 62 as illustrated in FIG. 14. The reaction of the first metallic material with the semiconductor material underneath the semiconductor surface of the semiconductor substrate 8 can be effected, for example, by a thermal anneal, which can be performed at a temperature between 400° C. and 800° C. in an inert (non-oxidizing)

ambient. The first metallic material portion 62 can thus be converted into the metal semiconductor alloy portion 62. If the first doped semiconductor portion 20 includes silicon and/or germanium, the metal semiconductor alloy portion 62 can include a metal silicide and/or a metal germanide. If the first doped semiconductor portion 20 includes silicon and/or germanium and if the first doped semiconductor portion 20 includes Ni, the metal semiconductor alloy portion 62 can include nickel silicide and/or nickel germanide.

Figure 15:
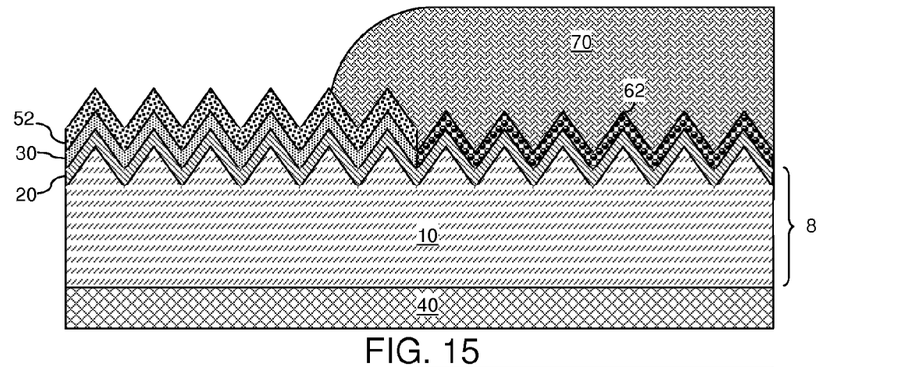
FIG. 15 is a vertical cross-sectional view of the exemplary structure after plating a second metallic material directly on the metal semiconductor alloy portion while preventing growth of the second metallic material from the titania layer according to an embodiment of the present disclosure.

Referring to FIG. 15, a dilute hydrofluoric acid can be optionally employed to clean the surfaces of the metal semiconductor alloy portion 62 and the titania layer 52. Optionally, a thin layer of nickel can be electroplated on the conductive surface of the metal semiconductor alloy portion 62 selective to the dielectric surface of the titania layer 52. A second metallic material is plated directly on the metal semiconductor alloy portion 62, while preventing growth of the second metallic material from the titania layer 52, to form a second metallic material portion 70.

Because the first dielectric material layer 30 and the titania layer 50 are not conductive, the second metallic material does not grow from the surface of the titania layer 52. Thus, the plating process does not cause the second metallic material to grow from the titania layer 52, and growth of the second metallic material from the titania layer 52 is prevented during the plating of the second metallic material.

The second metallic material can be any metallic material that can be plated by electroplating as known in the art. The second metallic material can include, for example, Au, Ag, Cr, Zn, Sn, Cd, Ni, or a Ni—Co alloy. If the second metallic material is an elemental metal or an intermetallic alloy, the second metallic material portion 70 is a metal portion, which is herein referred to as a second metal portion. In one embodiment, the second metallic material can be Cu.

The thickness of the second metallic material can be from 50 nm to 2,000 nm, although lesser and greater thicknesses can also be employed. The thickness of the second metallic material can be selected so that the second metallic material is deposited over the top surface of the titania layer 52. In this case, the second metallic material grows over a peripheral top surface of the titania layer 52 during plating of the second metallic material. In general, at least one metallic material among the first and second metallic material can grow over a peripheral top surface of the titania layer 52 during plating of one of the at least one metallic material.

In an alternate embodiment, the conversion of the first metallic material portion 60 into the metal semiconductor alloy portion 62 can be postponed until after a second metallic material is plated directly on the first metallic material portion 60. In this embodiment, a stack of the first metallic material portion 60 and a second metallic material portion 70 is formed first, and a thermal anneal can be subsequently performed to convert the first metallic material portion 60 into the metal semiconductor alloy portion 62. In other words, before formation of any metal semiconductor alloy portion, the second metallic material is plated directly on the first metallic material, while preventing growth of the second metallic material from the titania layer 52. The resulting structure is identical to the exemplary structure illustrated in FIG. 15.

In yet another alternate embodiment, the thermal conversion of the first metallic material portion 60 into a metal semiconductor alloy portion can be omitted. In this case, the resulting structure is similar to the structure illustrated in FIG. 15 with the exception that the metal semiconductor alloy portion 62 of FIG. 15 is substituted with the first metallic material portion 60 of FIG. 14.

In still another alternate embodiment, formation of the first metallic material portion 60 and the subsequent thermal conversion process can be omitted, and the second metallic material portion 70 can be plated directly on the first doped semiconductor portion 20 such that the second metallic material portion 70 grows over a peripheral top surface of the titania layer 52 during plating of the second metallic material. In this case, the resulting structure is similar to the structure illustrated in FIG. 15 with the exception that the volume occupied by the metal semiconductor alloy portion 62 of FIG. 15 is occupied by the second metallic material portion 70 of FIG. 14, and that the second metallic material portion 70 is in direct contact with the first doped semiconductor portion 20.

Figure 16:
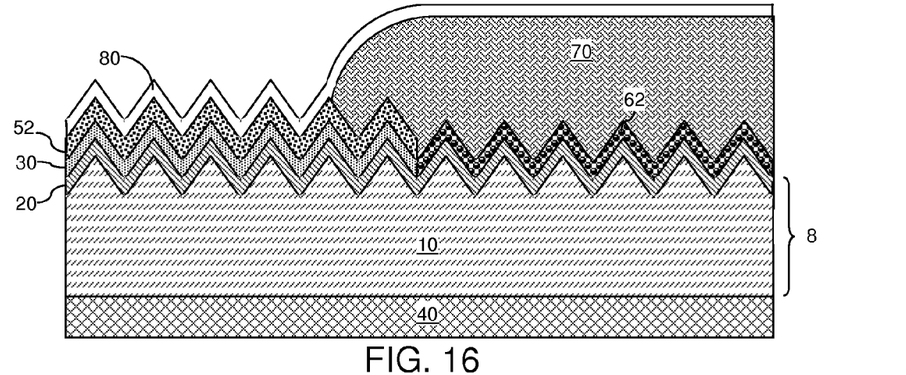
FIG. 16 is a vertical cross-sectional view of the exemplary structure after deposition of a second dielectric material layer according to an embodiment of the present disclosure.
Figure 17:
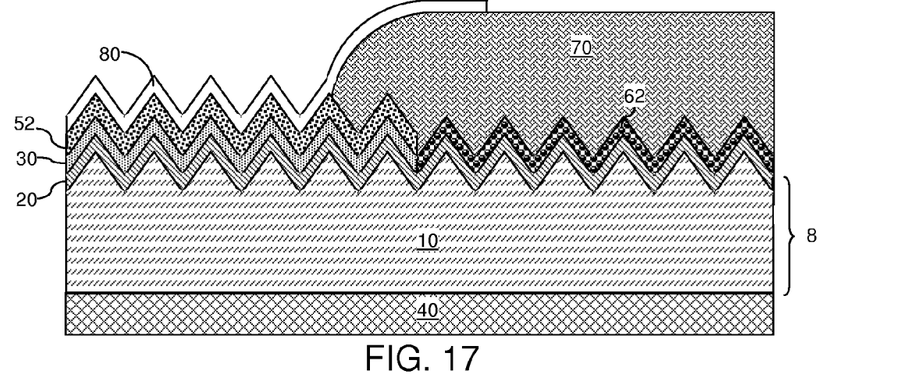
FIG. 17 is a vertical cross-sectional view of the exemplary structure after forming an opening within a portion of the second dielectric material layer over a topmost surface of the second metallic material according to an embodiment of the present disclosure.
Figure 18:
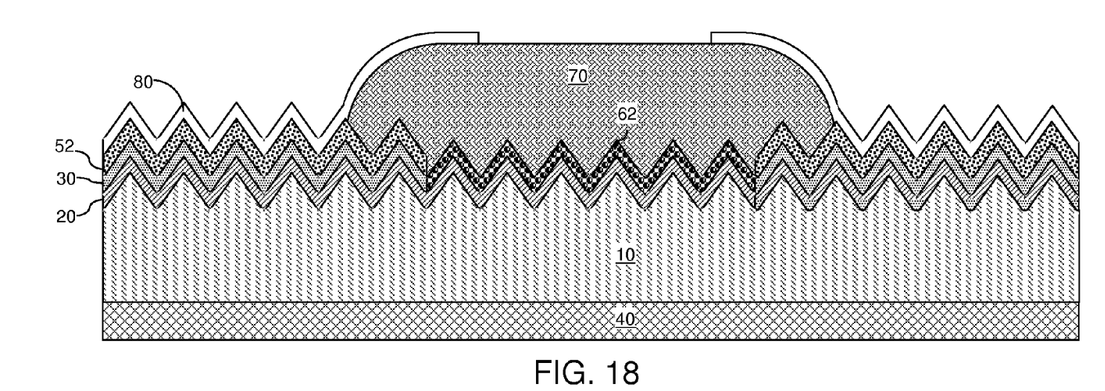
FIG. 18 is a vertical cross-sectional view of a busbar region of the exemplary structure at a processing step corresponding to FIG. 17.
Figure 19:
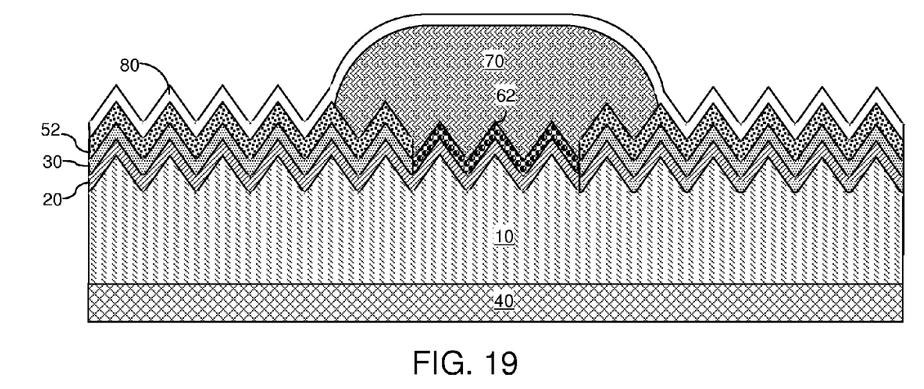
FIG. 19 is a vertical cross-sectional view of a finger region of the exemplary structure at the processing step corresponding to FIG. 17.

Referring to FIG. 16, a second dielectric material layer 80 is deposited on the titania layer 52 and the second metallic material of the second metallic material portion 70. In one embodiment, the second dielectric material layer 80 can include a material selected from silicon nitride, silicon oxide, and magnesium oxide. The second dielectric material layer 80 can be deposited, for example, by chemical vapor deposition (CVD), atomic layer deposition (ALD), vacuum evaporation, or a combination thereof. The thickness of the second dielectric material layer 80 can be from 20 nm to 200 nm, although lesser and greater thicknesses can also be employed.

The first dielectric material layer 30, the titania layer 52, and the second dielectric material layer 80 collectively form an anti-reflective coating layer in regions that are not covered by the second metallic material. In one embodiment, the thicknesses of the various layers among the first dielectric material layer 30, the titania layer 52, and the second dielectric material layer 80 can be tuned to optimize the effectiveness of the anti-reflective coating layer within the wavelength range of the solar radiation. For example, the thicknesses of the various layers among the first dielectric material layer 30, the titania layer 52, and the second dielectric material layer 80 can be optimized to reduce reflection of light at the antreflective coating layer in a wavelength range from 400 nm to 800 nm in which the energy of the solar radiation is concentrated.

Figure 20:
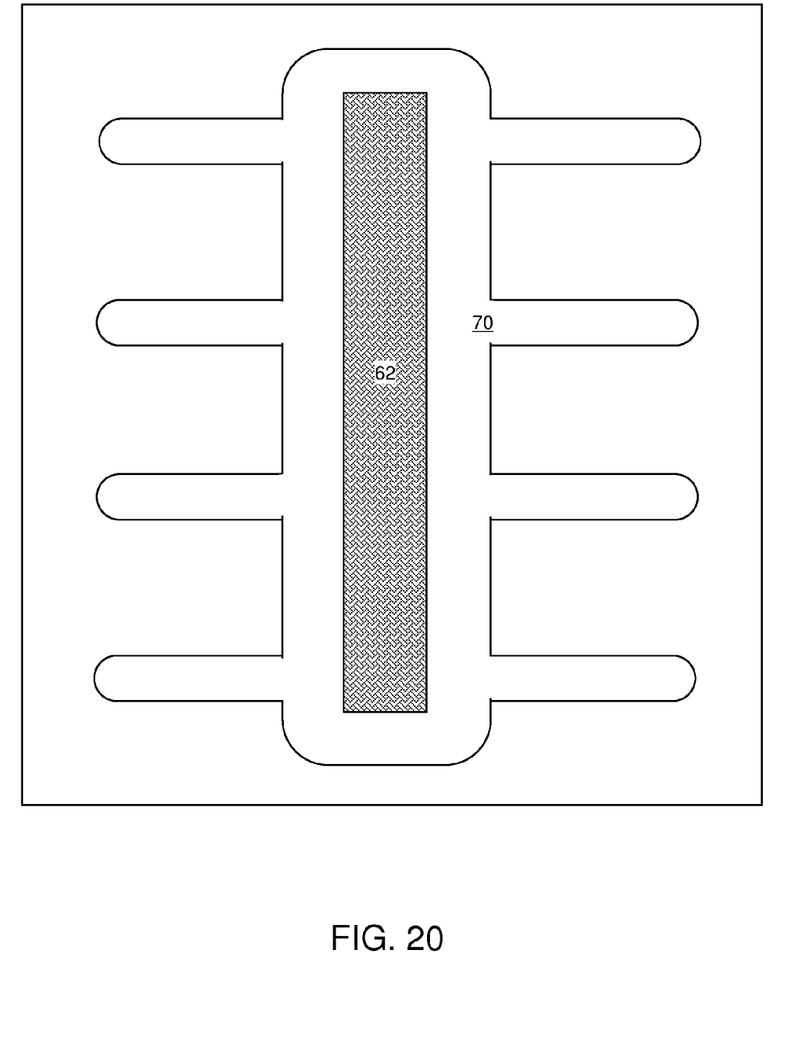
FIG. 20 is a top-down view of the exemplary structure at the processing step corresponding to FIG. 17.

Referring to FIGS. 17-20, an opening can be formed within a portion of the second dielectric material layer 80 over a topmost surface of the second metallic material portion 70 so that electrical contacts can be made to selected regions of the second metallic material portion 70. In one embodiment, the second metallic material portion 70 can be formed in a shape including a busbar and a plurality of fingers extending from the busbar as illustrated in FIG. 20. In this case, the opening in the second dielectric material layer 80 can be made over a center portion of the busbar. The second metallic material portion 70, as provided in a configuration of a busbar and a plurality of fingers extending therefrom, can provide electrical contact to the entirety of the first doped semiconductor portion 20 without excessively blocking radiation that impinges on the front surface of the semiconductor substrate 8 that includes a p-n junction and can operate as a solar cell. The back side contact layer 40 provides electrical contact to the semiconductor layer 10 that has a doping of the opposite type from the first doped semiconductor portion 20.

The exemplary structure illustrated in FIGS. 17-20 is an anti-reflective coating (ARC) structure in which the first dielectric material layer 30, the titania layer 52, and the second dielectric material layer 80 collectively constitute an anti-reflective coating layer. The ARC structure includes the semiconductor substrate 8, the first dielectric material layer 30 located on the semiconductor substrate 8, the titania layer 52 located on the first dielectric material layer 30, at least one metallic material portion (62, 70) in contact with the semiconductor material (i.e., the semiconductor material of the first doped semiconductor portion 20) of the semiconductor substrate 8 and overlying a portion of the titania layer 52, and the second dielectric material layer 80 located on the titania layer 52 and an outer surface of the at least one metallic material portion (62, 70).

The at least one metallic material portion (62, 70) can include the metal semiconductor alloy portion 62 that is in contact with the semiconductor material in the semiconductor substrate 8. The metal semiconductor alloy portion 62 can include an alloy of an electroplatable metal and the semiconductor material of the first doped semiconductor portion 20. The at least one metallic material portion (62, 70) can further include the second metallic material portion 70, which can be a metal portion, that is in contact with a top surface of the titantia layer 52.

In one embodiment, the metallic semiconductor alloy portion 62 is not in contact with the top surface of the titania layer 52. In one embodiment, a portion of the first dielectric material layer 30 can underlie a portion of the second metallic material portion 70, which can be a metal portion, and does not underlie the metal semiconductor alloy portion 62. In one embodiment, the first dielectric material layer 30 can be in lateral contact with the metal semiconductor alloy portion 62. In one embodiment, a portion of the top surface of the titania layer 52 can be in contact with the second dielectric material layer 80, another portion of the top surface of the titania layer 52 can be is in contact with the at least one metallic material portion (62, 70), and a portion of the second dielectric material layer 80 can be in contact with a peripheral portion of the top surface of the at least one metallic material portion (62, 70), i.e., in contact with a peripheral portion of the top surface of the second metallic material portion 70.

The ARC structure further includes a p-n junction located within the semiconductor substrate 8 and vertically offset from the interface between the at least one metallic material portion (62, 70) and the semiconductor substrate 8. A first interface betweens the semiconductor substrate 8 and the first dielectric material layer 30 and a second interface betweens the semiconductor substrate 8 and the at least one metallic material portion (62, 70) can be faceted.

The ARC structure of the present disclosure can be employed to form a photovoltaic device. As used herein, a "photovoltaic device" refers to any device that generates electricity by exposure to infrared, visible, and/or ultraviolet radiation, can be manufactured on a semiconductor substrate including a p-n junction by providing electrical contacts to the p-type semiconductor material and electrical contacts to the n-type semiconductor material within the semiconductor substrate. By employing the ARC layer of the present disclosure that incorporates a titania layer, reflection of incident radiation can be minimized for the photovoltaic device.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. An anti-reflective coating (ARC) structure comprising:
   a semiconductor substrate having a first region and an adjacent second region;
   a first dielectric material layer located continuously on a topmost surface of said first region of said semiconductor substrate, but not said second region of said semiconductor substrate;
   a titania layer located continuously on a topmost surface of said first dielectric material layer, but not said second region of said semiconductor substrate;
   a first metallic portion located directly on a topmost surface of said second region of said semiconductor substrate, but not said titania layer;
   a second metallic material having a first portion in direct physical contact with a topmost surface of said first metallic portion and a second portion that is in direct physical contact with a topmost surface of said titania layer; and
   a second dielectric material layer that is in direct physical contact with an exposed portion of said titania layer and that is in direct physical contact with at least an outer surface portion of said second metallic material portion, wherein said first dielectric material layer, said titania layer, and said second dielectric material layer collectively constitute an anti-reflective coating layer.

2. The ARC structure of claim 1, wherein said first metallic material portion comprises a metal semiconductor alloy portion.

3. The ARC structure of claim 1, wherein said first dielectric material layer comprises silicon nitride, and said second dielectric material layer comprises a material selected from silicon nitride, silicon oxide, and magnesium.

4. The ARC structure of claim 1, wherein said semiconductor substrate comprises a semiconductor material.

5. The ARC structure of claim 4, wherein said semiconductor material is single crystalline.

6. The ARC structure of claim 4, wherein said semiconductor material is polycrystalline.

7. The ARC structure of claim 1, wherein said semiconductor substrate has a planar topmost surface.

8. The ARC structure of claim 1, wherein said semiconductor substrate has a faceted topmost surface in said first and second regions.

9. The ARC structure of claim 1, wherein said second metallic material portion comprises Ni.

10. The ARC structure of claim 1, wherein said second dielectric material layer comprises silicon nitride, silicon oxide or magnesium oxide.

11. The ARC structure of claim 1, wherein said semiconductor substrate comprises a p-n junction.

12. An anti-reflective coating (ARC) structure comprising:
   a semiconductor substrate having a first region, a second region, and a third region, wherein said second region is positioned between said first and third regions;
   a first dielectric material layer located continuously on a topmost surface of said first region and on a topmost surface of the third region of said semiconductor substrate, but not said second region of said semiconductor substrate;
   a titania layer located continuously on a topmost surface of said first dielectric material layer on said first region and the third region of said semiconductor substrate, but not said second region of said semiconductor substrate;
   a first metallic portion located directly on a topmost surface of said second region of said semiconductor substrate, but not said titania layer;

a second metallic material portion having a first portion in direct physical contact with an entire topmost surface of said first metallic portion, a second portion located directly on a portion of a topmost surface of said titania layer within said first region and a third portion located directly on a portion of a topmost surface of said titania layer within said third region; and a second dielectric material layer that is in direct physical contact with an exposed portion of said titania layer in said first and third regions and that is in direct physical contact with at least an outer surface portion of said second metallic material portion, wherein said first dielectric material layer, said titania layer, and said second dielectric material layer collectively constitute an anti-reflective coating layer.

13. The ARC structure of claim 12, wherein said first metallic material portion comprises a metal semiconductor alloy portion.

14. The ARC structure of claim 12, wherein said first dielectric material layer comprises silicon nitride, and said second dielectric material layer comprises a material selected from silicon nitride, silicon oxide, and magnesium oxide.

15. The ARC structure of claim 12, wherein said semiconductor substrate comprises a semiconductor material.

16. The ARC structure of claim 15, wherein said semiconductor material is single crystalline or polycrystalline.

17. The ARC structure of claim 12, wherein said semiconductor substrate has a planar topmost surface in said first, second and third regions.

18. The ARC structure of claim 12, wherein said semiconductor substrate has a faceted topmost surface.

19. The ARC structure of claim 12, wherein said semiconductor substrate comprises a p-n junction.

* * * * *